United States Patent
Stejskal et al.

(10) Patent No.: US 11,114,275 B2
(45) Date of Patent: Sep. 7, 2021

(54) METHODS AND SYSTEMS FOR ACQUIRING ELECTRON BACKSCATTER DIFFRACTION PATTERNS

(71) Applicant: FEI Company, Hillsboro, OR (US)

(72) Inventors: Pavel Stejskal, Brno (CZ); Christopher J. Stephens, West Sussex (GB)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/460,749

(22) Filed: Jul. 2, 2019

(65) Prior Publication Data
US 2021/0005420 A1 Jan. 7, 2021

(51) Int. Cl.
*H01J 37/00* (2006.01)
*H01J 37/295* (2006.01)
*G01N 23/20058* (2018.01)
*G01N 23/203* (2006.01)
*H01J 37/244* (2006.01)
*H01J 37/26* (2006.01)

(52) U.S. Cl.
CPC ........ *H01J 37/2955* (2013.01); *G01N 23/203* (2013.01); *G01N 23/20058* (2013.01); *H01J 37/244* (2013.01); *H01J 37/261* (2013.01); *H01J 2237/24475* (2013.01); *H01J 2237/24485* (2013.01); *H01J 2237/24495* (2013.01)

(58) Field of Classification Search
USPC ................................................ 250/310, 306
See application file for complete search history.

(56) References Cited

U.S. PATENT DOCUMENTS

| | | | |
|---|---|---|---|
| 8,890,065 B2 * | 11/2014 | Statham | G01N 23/203 250/305 |
| 9,535,020 B2 * | 1/2017 | Schillinger | G01N 23/223 |
| 9,618,463 B2 | 4/2017 | Uncovsky et al. | |
| 9,791,390 B2 * | 10/2017 | Wright | G01N 23/20058 |
| 9,983,152 B1 * | 5/2018 | Randolph | G01N 23/2257 |
| 10,271,971 B2 * | 4/2019 | Hanada | A61L 31/022 |
| 2016/0356729 A1 | 12/2016 | Bauer | |

OTHER PUBLICATIONS

S. Vespucci, et al., Digital direct electron imaging of energy-filtered electron backscatter diffraction patterns, Physical Review B 92, Nov. 6, 2015, 205301 1-9, United Kingdom.
European Search Report for corresponding application, dated Jan. 19, 2021, EP App No. 20183254.0.
A.P. Day et al., A comparison of grain imaging and measurement using horizontal orientation and colour orientation contract imaging, electron backscatter pattern and optical methods, Journal of Microscopy, vol. 95, Pt. 3, Sep. 1999, pp. 186-196.

* cited by examiner

*Primary Examiner* — Phillip A Johnston

(57) ABSTRACT

Various methods and systems are provided for acquiring electron backscatter diffraction patterns. In one example, a first scan is performed by directing a charged particle beam towards multiple impact points within a ROI and detecting particles scattered from the multiple impact points. A signal quality of each impact point of the multiple impact points is calculated based on the detected particles. A signal quality of the ROI is calculated based on the signal quality of each impact point. Responsive to the signal quality of the ROI lower than a threshold signal quality, a second scan of the ROI is performed. A structural image of the sample may be formed based on detected particles from both the first scan and the second scan.

20 Claims, 6 Drawing Sheets

METHODS AND SYSTEMS FOR ACQUIRING ELECTRON BACKSCATTER DIFFRACTION PATTERNS

FIELD OF THE INVENTION

The present description relates generally to methods and systems for acquiring backscattered electrons, and more particularly, to data-driven electron backscatter diffraction pattern acquisition.

BACKGROUND OF THE INVENTION

When a sample is irradiated with a charged particle beam, such as an electron beam, various types of emissions may generate from the sample. Among them, backscattered electrons consist of high-energy electrons that are reflected or back-scattered out of an interaction volume of the sample by elastic scattering interactions between the charged particle beam and the sample atoms. The backscattered electrons may be collected by a detector in the form of a two-dimensional electron backscatter diffraction (EBSD) pattern. Structural information, such as the crystal orientation, in the interaction volume may be determined through analysis and interpretation of the EBSD pattern.

SUMMARY

In one embodiment, a method for imaging a sample includes performing a first scan by directing a charged particle beam towards multiple impact points within a ROI, and detecting particles scattered from each impact point of the multiple impact points; calculating a signal quality of each impact point of the multiple impact points based on the detected particles scattered from the impact point; calculating a signal quality of the ROI based on the signal quality of each impact point, wherein the signal quality of the ROI is lower than a threshold signal quality; performing a second scan by directing the charged particle beam towards one or more of the multiple impact points within the ROI after calculating the signal quality of the ROI, and detecting particles scattered from the one or more of the multiple impact points within the ROI; and forming a structural image of the ROI based on the detected particles during the first scan and the second scan. In this way, the dwell time of the charged particle beam at each impact point may be reduced. Further, the EBSD pattern acquisition may be terminated based on the quality of the acquired data, so that the total data acquisition time and sample damage by the charged particle beam may be reduced.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for acquiring electron backscatter diffraction (EBSD) patterns and generating a structural image of the sample based on the EBSD patterns. The EBSD patterns may be acquired by an imaging system shown in FIG. 1. In one example, as shown in FIG. 2, an EBSD pattern is generated based on scattered electrons detected responsive to a charged particle beam impinging an impact point of the sample. Based on the EBSD pattern, structural information, such as crystal orientation information, at the impact point may be extracted and forms a pixel in the structural image. By scanning the charged particle beam over a region of interest (ROI), the structural image of the ROI may be generated.

Conventionally, the EBSD pattern may be detected by a planar phosphor or direct electron detector. For example, after irradiating an impact point for a dwell time, a frame of EBSD pattern is readout from the detector as a two-dimensional matrix (that is, a frame). The dwell time for acquiring each EBSD pattern may be in the range of 0.1-100 ms. Increased dwell time may increase the signal to noise ratio of the EBSD pattern, so that the structural information may be reliably extracted. However, high intensity signals may saturate the detector. Long dwell time also increases the total data acquisition time and may introduce radiation damage to the sample. Even with a frame rate of 5000 fps for EBSD pattern readout, acquiring all EBSD patterns of the ROI may take several minutes. Further, the charged particle beam may drift during the data acquisition process. The beam drift may be difficult to compensate due to non-uniform pixel-by-pixel shift in the structural image. Moreover, when performing energy-dispersive X-ray spectroscopy (EDS) together with EBSD pattern acquisition, the long dwell time may saturate the EDS detector.

Figure 3:
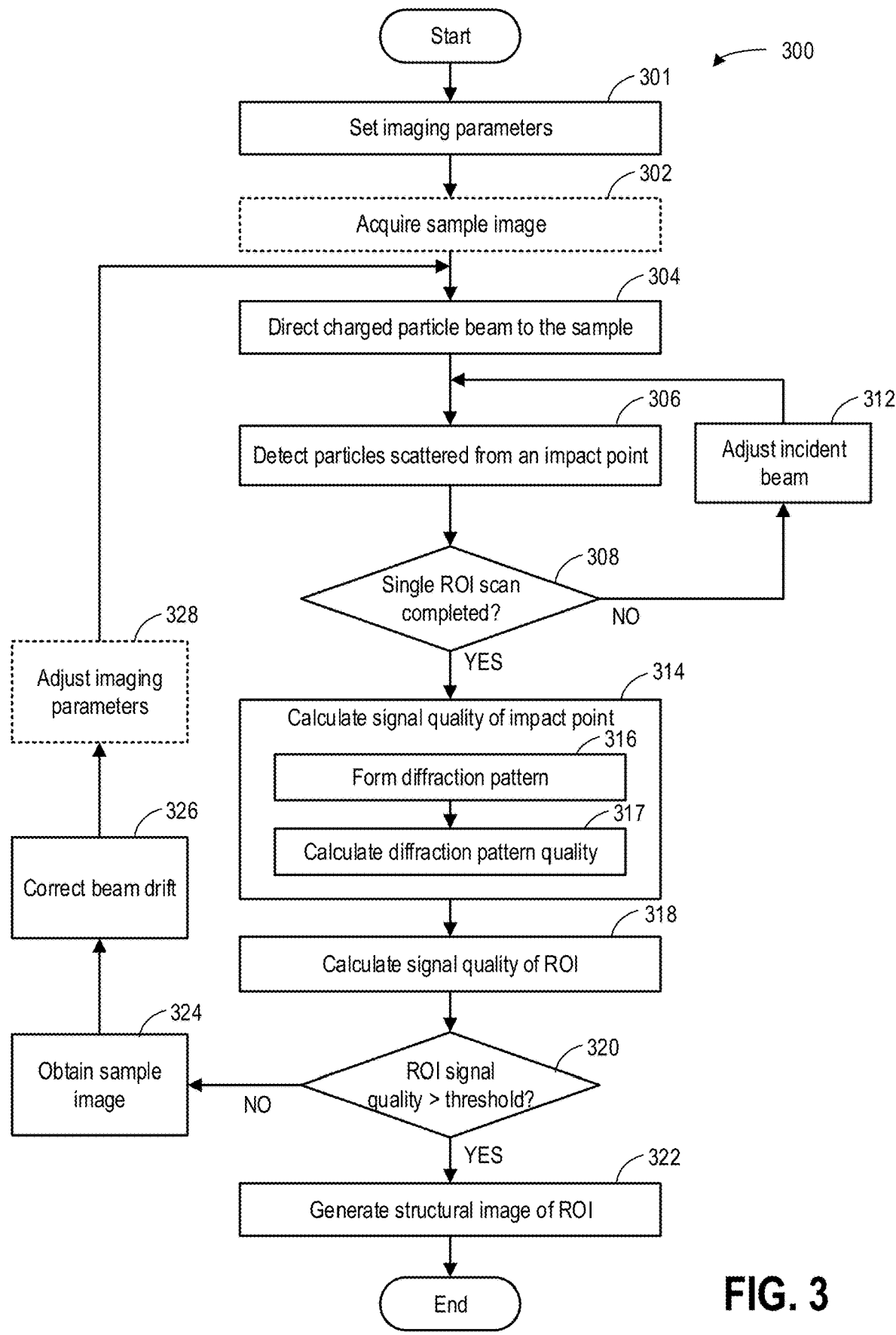
FIG. 3 is a flow chart of a method for forming the structural image based on data-driven EBSD pattern acquisition.
Figure 4A:
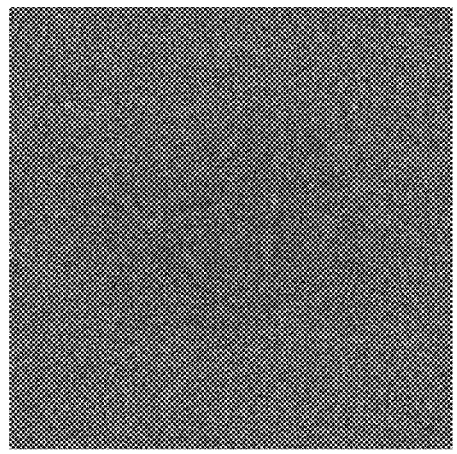
FIGS. 4A, 4B, 4C, 4D, 4E and 4F are EBSD patterns of an impact point formed over time.
Figure 4B:
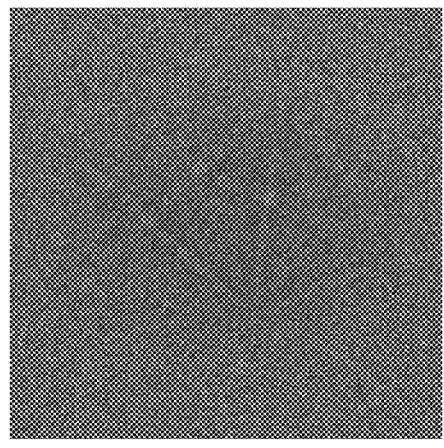
Figure 4C:
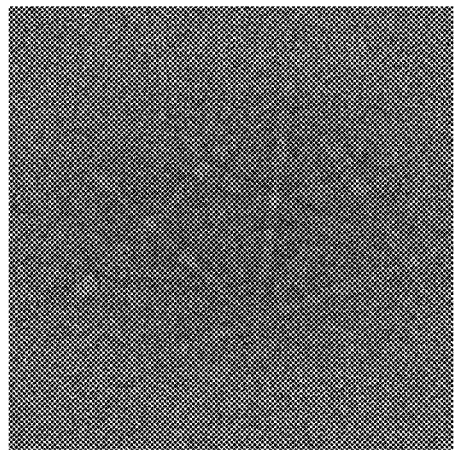
Figure 4D:
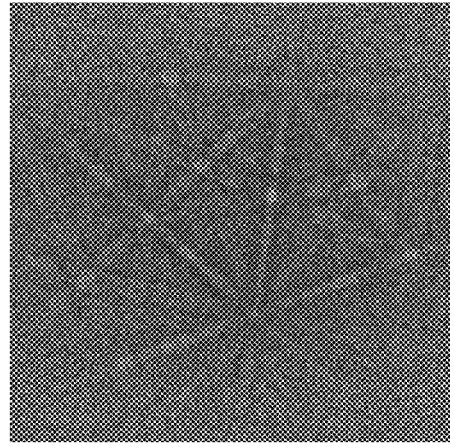
Figure 4E:
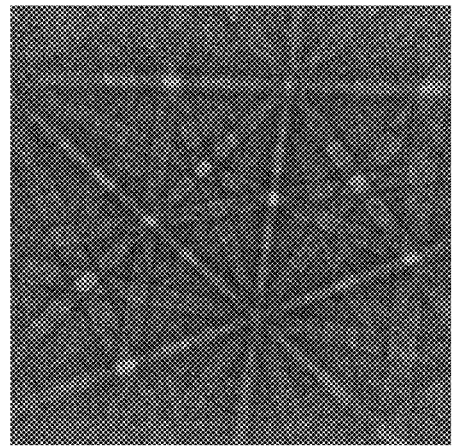
Figure 4F:
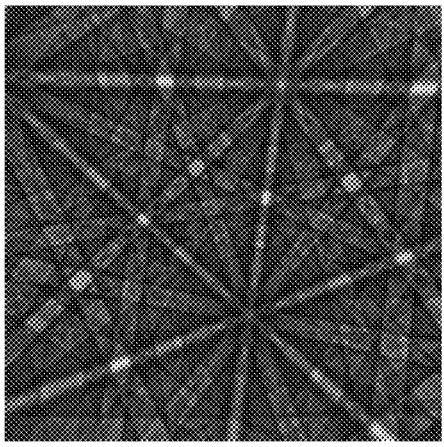
Figure 5B:
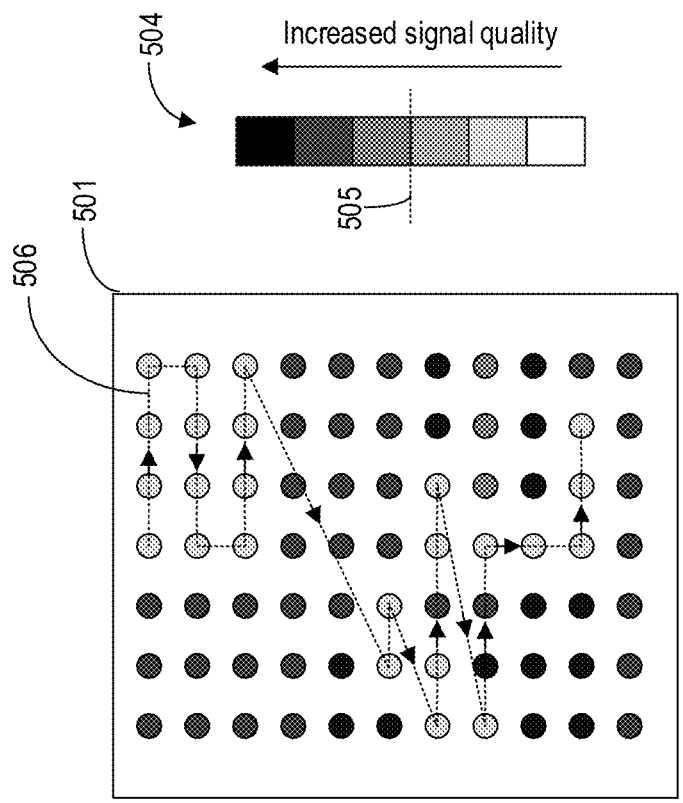
FIGS. 5A and 5B show different scan patterns for imaging a region of interest.
Figure 5A:
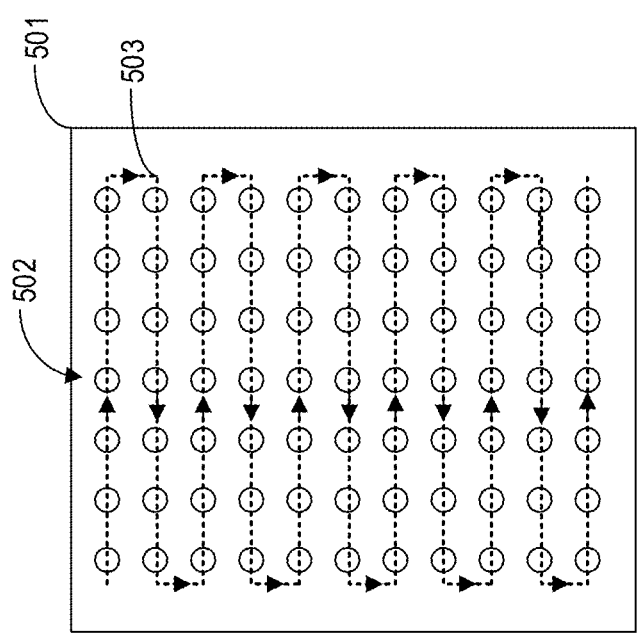
Figure 6:
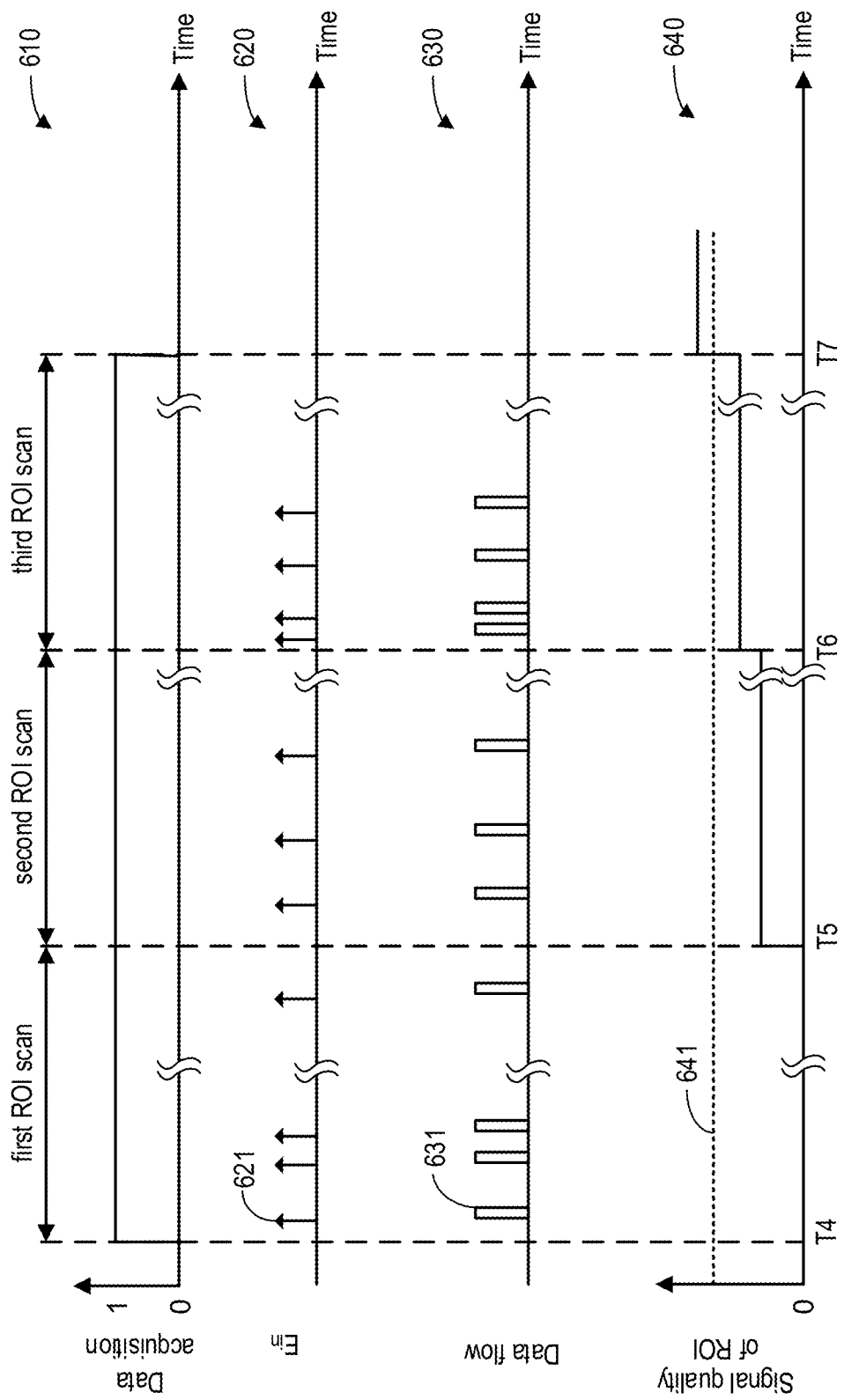
FIG. 6 shows an exemplary timeline for acquiring the EBSD patterns.

In order to address the above issues, FIG. 3 shows a method for generating a structural image of the sample based on data-driven EBSD pattern acquisition. Instead of the conventional single-frame readout, data related to each electron is readout immediately responsive to the electron striking on the detector. A ROI of the sample is repetitively scanned with short dwell time until the signal quality of the ROI reaches a threshold level. In this way, the dwell time of the charged particle beam at each impact point of the ROI during a single scan may be reduced over two orders comparing to the single-frame readout method. Moreover, the total data acquisition time is sample dependent, which may further reduce the radiation damage to the sample. FIGS. 4A-4F show example EBSD patterns generated based on particles scattered from a single impact point during the repetitive scan of the ROI. The signal quality of the impact point (in this case the quality of the EBSD) increases over time. Imaging parameters, such as the scan pattern for each single scan of the ROI, may be adjusted based on the signal quality of each impact point. FIGS. 5A and 5B show example scan patterns of the ROI for different single scan of the same ROI. FIG. 6 shows an example timeline for acquiring the EBSD patterns.

Figure 1:
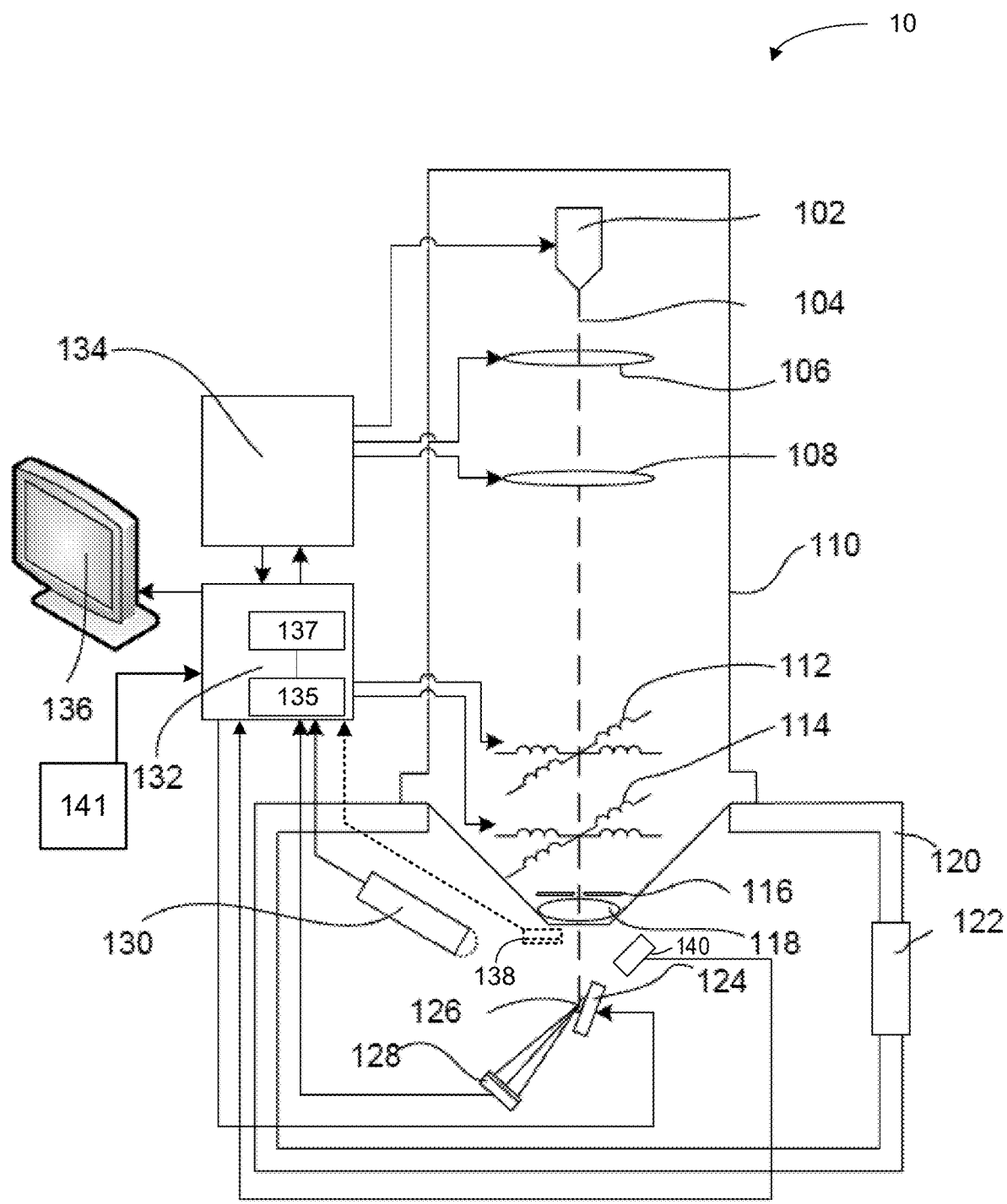
FIG. 1 shows an imaging system for electron backscatter diffraction (EBSD) pattern acquisition, according to an exemplary embodiment.
Figure 2:
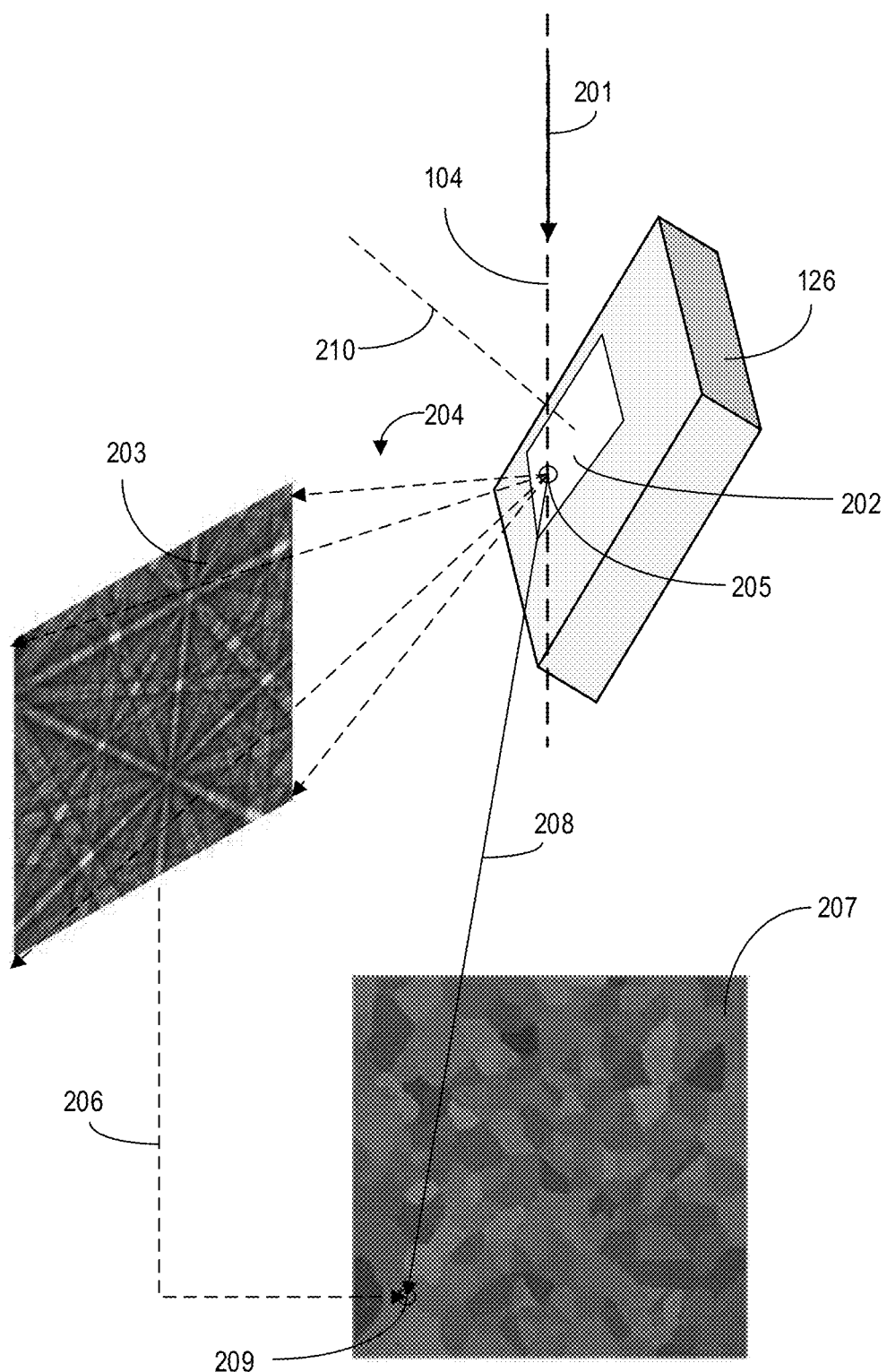
FIG. 2 illustrates an example procedure to form a structural image based on the EBSD patterns.

Turning to FIG. 1, an example charged particle imaging system 10, such as a scanning electron microscope (SEM), may be used for acquiring the EBSD patterns. The imaging system 10 may include an electron beam column 110 placed on a sample chamber 120. The electron beam column 110 includes an electron source 102 for producing a beam of energetic electrons with a selectable energy of, for example, between 500 eV and 30 keV, along emission axis 104. The electron beam may be manipulated by lenses (106, 108, 118), deflectors (112, 114), and beam limiting apertures (116) to form a finely focused spot on sample 126.

The sample chamber 120 may optionally comprise an airlock 122 for introducing the sample therein and placing the sample on sample holder 124. The sample holder 124 may rotate or translate/shift the sample so that the ROI on the sample surface may be irradiated by the finely focused electron beam under a selectable tilt angle. The sample chamber 120 further includes one or more detector for receiving particles emitted from the sample. The detectors may include the EDS detector 140 for detecting x-rays, the EBSD detector (128 or 138) for detecting backscatter electrons, and the Everhart-Thornley detector 130 for detecting the secondary electrons. The EBSD detector may be a position sensitive detector. For example, responsive to an event of a single electron impinging the detector, data related to the event, such as the time of impact, the relative impact location on the detector, and the energy of the electron may be transmitted from the detector to the controller 132. In one example, the EBSD detector is a pixelated detector. Both the electron beam column 110 and the sample chamber 120 may be connected with high vacuum pump to evacuate the enclosed volumes.

The sample may be positioned at different angles relative to the emission axis 104 to acquire different images of the sample. For example, a SEM image may be acquired via detector 130 by positioning the sample 126 surface facing the incident beam. That is, the sample axis is aligned with the emission axis 104. The EBSD patterns may be acquired via EBSD detector 128 by positioning the sample at an angle of about 70 degrees relative to the emission axis 104. The EBSD patterns may be acquired via EBSD detector 138 by positioning the sample at angle of less than 45 degrees relative to the emission axis 104. In some embodiments, the SEM image may also be acquired by positioning the sample at an angle relative to the emission axis.

In some embodiments, the voltages and/or currents needed for the working of the (magnetic or electrostatic) lenses and of the electron source are generated/controlled by the column controller 134, while the controller 132 generates deflection signals for the deflectors and samples the signals of the detectors. The controller 132 may be connected to a display unit 136 for displaying information, such as an image of the sample. The controller 132 may also receive operator inputs from the input device 141. The input device may be a mouse, a keyboard, or a touchpad. The controller may translate, shift, or tilt the sample relative to the incident beam by moving the sample holder 124. The controller 132 may scan the sample with the charged particle beam by adjusting the beam via the deflectors 112 and/or 114.

The controller 132 may include a processor 135 and a non-transitory memory 137 for storing computer readable instructions. By executing the computer readable instructions stored in the non-transitory memory, the controller may implement the various methods disclosed herein. For example, the controller 132 may be configured to process the signals received from the multiple detectors, and reconstruct SEM image, EBSD pattern, or crystallographic orientation image of the sample. The controller 132 may also include field-programmable gate array (FPGA) configured to process signals received from various detectors.

Though a SEM system is described by way of example, it should be understood that the imaging system may be other types of charge-particle microscopy system, such as transmission electron microscopy (TEM), scanning transmission electron microscopy (STEM), or a dual beam tool such as a focused ion beam combined with scanning electron microscopy (FIB-SEM). The present discussion of the SEM system is provided merely as an example of one suitable imaging system for acquiring the backscatter electrons.

FIG. 2 illustrates an example procedure to form the structural image of ROI 202 based on EBSD patterns acquired using the imaging system of FIG. 1. Electron beam 201 irradiates sample 126 along the emission axis 104. The electron beam 201 impinges the sample 126 at impact point 205 within the ROI 202 of the sample surface. The impact point may be a volume of the sample that the irradiated elections interact with. Multiple impact points are located within the ROI. Herein, only impact point 205 is shown as an example. The sample 126 is positioned at a fixed angle relative to the emission axis 104 during the EBSD pattern acquisition. For example, the sample axis 210, which is normal to the sample surface, may be positioned 70 degrees relative to the emission axis 104, so that the beam impinges the sample surface under a shallow angle of 20 degrees. In another example, the angle between the sample axis and the emission axis may be less than 45 degrees. While the impact point 205 is irradiated by the electron beam, backscatter electrons from the impact point are detected by the EBSD detector. A two-dimensional EBSD pattern 203 may be formed based on the detected backscattered electrons from impact point 205. By analyzing the EBSD pattern 203, information such as crystal orientation and crystallographic phase at the impact point 205 may be determined. The crystal orientation may be calculated from the measured Kikuchi bands in the EBSD pattern 203. In one example, the crystal orientation is determined by matching known EBSD patterns (or simulated versions thereof) with the observed EBSD patterns. In another example, the crystal orientation is calculated by comparing the measured angles between the Kikuchi bands with theoretical interplanar angles determined using standard crystallographic principles. The crystal orientation may be color-coded and shown as pixel 209 in the crystallographic orientation image 207. By scanning the multiple impact points within the ROI 206, 2D crystallographic orientation image 207 may be generated. Each pixel of the crystallographic orientation image 207 corresponds to one impact point in the ROI 202, as indicated by arrow 208.

FIG. 3 shows method 300 for acquiring EBSD patterns and generating structural image of the sample based on the EBSD patterns. Method 300 may be implemented by executing the computer readable instructions stored in the non-transitory memory of the controller of an imaging system, such as controller 132 of FIG. 1. The EBSD patterns are acquired using a position sensitive EBSD detector by repetitively scanning the ROI of the sample with the charged particle beam. After each single scan of the ROI, the signal quality of the ROI is updated based on the signal quality of each impact point within the ROI. The EBSD pattern acquisition may be terminated responsive to the signal quality of ROI higher than a threshold signal quality. Moreover, beam drift may be corrected after each single scan of the ROI. The structural image of the ROI may be constructed based on the EBSD patterns.

At 301, the imaging parameters are set. The imaging parameters may include the primary beam energy, the current density of the charged particle beam, and the dwell time of the charged particle beam at each impact point within the ROI during a single scan. The dwell time may be predetermined based on sample type. For example, the dwell time may decrease if the sample is more prone to radiation damage. In another example, the dwell time may increase if the sample is a multiphase material. The dwell time may also decrease responsive to higher current density of the charged particle beam. For example, the dwell time is less than 100 microseconds. In one example, the dwell time is 1 microsecond. The imaging parameters may include the resolution of the structural image, or the scan resolution of the ROI. For example, setting the resolution of the structural image includes determining the step size of the scan, or the distance between adjacent impact points. The imaging parameters may include a threshold signal quality for terminating acquiring the EBSD patterns.

At 302, a sample image may optionally be acquired. The imaging area of the sample image may be equal or greater than the ROI. In one embodiment, the sample image may be a SEM image formed based on secondary electrons from the sample. In another embodiment, the sample image may be an optical image of the sample, acquired without scanning the sample with the charged particle beam.

At 304, the charged particle beam is directed to an impact point located within the ROI of the sample.

At 306, while the charged particle beam is stationary relative to the sample, backscattered particles (such as electrons) are detected by the detector, such as the EBSD detector. For example, responsive to each particle impinging on the detector, the detector outputs one or more of the energy, the timestamp, and the location information of the particle to the controller or the FPGA in the controller. The timestamp is the time at which the particle impinges the detector. The location information is the relative location on the detector at which the particle is detected. In one example, the electron energy is determined based on the duration of a signal output from the detector higher than a threshold level. In one example, a single frame of the EBSD pattern may be formed based on the recorded energy or timestamp of the electron, and the location of the electrons. The charged particle beam may irradiate one impact point for a duration of a dwell time, before irradiating another impact point located at a different location of the ROI.

In some embodiments, the imaging system may include the EDS detector for acquiring the X-ray emitted from the impact point of the sample. After irradiating the impact point for the duration of the dwell time, the EDS detector may output the accumulated X-ray energy spectra corresponding to the impact point to the controller.

At 308, method 300 determines whether the single scan of the ROI with the charged particle beam is completed. In one embodiment, the single scan of the ROI is completed if all impact points within the ROI have been irradiated or scanned with the charged particle beam since step 304. In another embodiment, the single scan of the ROI is completed if the same impact point is going to be irradiated again with the charged particle beam. Responsive to the completion of the single scan of the ROI, signal quality of impact point is calculated at 314. If the single scan of the ROI is not completed, the incident beam is adjusted to irradiate another impact point within the ROI at 312.

At 314, signal quality of each impact point is calculated. The signal quality of an impact point indicates the quality of the acquired signal from the impact point for extracting the structural information. In one example, the signal quality of a particular impact point may be calculated based on the detected particles scattered from the impact point since the start of method 300. In another example, the signal quality of a particular impact point may be calculated based on the detected particles scattered from the impact point during multiple single scans of the ROI. In yet another example, the signal quality of a particular impact point may be the quality of the diffraction pattern formed based on the detected particles scattered from the impact point. For an ROI includes a X-by-Y matrix of impact points, the signal quality of each impact point within the ROI may be expressed as $SQ_{impact\ point}(x, y)$, wherein (x, y) is the coordinate of the impact point in the ROI, and $x \in [1, X], y \in [1, Y]$. The signal quality of each impact point may be updated during or after each single scan of the ROI. The signal quality of each impact point may increase monotonically during the execution of method 300.

In one embodiment, at 316, a diffraction pattern, such as EBSD pattern, is formed for each impact point based on all of the detected electrons during the repetitive scan. In one example, the diffraction pattern may be formed based on the energy of detected electrons and their relative location on the detector. In other words, the energy of a particle scattered from the impact point that impinges coordinate (i, j) of the pixelated detector at time t may be expressed as $E_{i,j}^{x,y}(t)$, wherein (x,y) is the coordinate of the impact point within the ROI. The diffraction pattern corresponding to the impact point located at (x, y) of the ROI, formed at imaging time T, may be expressed as $D_{x,y}(i, j) = \int_{t=0}^{T} E_{i,j}^{x,y}(t)\ dt$. In another example, the diffraction pattern may be formed based on the number of detected electrons from the impact point and the relative location of the detected electrons on the detector. In other words, the number of particles scattered from an impact point that impinges coordinate (i, j) of the pixelated detector at time t may be expressed as $N_{i,j}^{x,y}(t)$, wherein (x,y) is the coordinate of the impact point within the ROI. The diffraction pattern corresponding to the impact point located at (x, y) of the ROI, formed at imaging time T, may be expressed as $D_{x,y}(i, j) = \int_{t=0}^{T} N_{i,j}^{x,y}(t)\ dt$.

At 317, the quality of the diffraction pattern is calculated. The quality of diffraction pattern is the signal quality of its corresponding impact point. The diffraction pattern quality indicates the quality of the diffraction pattern for extracting the structural information, such as crystal orientation. In one embodiment, the diffraction pattern quality is determined by statistically analyzing of the pixel values in the diffraction pattern. For example, the quality of the diffraction pattern is the entropy or standard deviation of the pixel values in the diffraction pattern. The diffraction pattern quality increases with decreased entropy or decreased standard deviation. In another example, the diffraction pattern quality is determined by statistically analyzing a transform of the diffraction pattern. The transform may be, but not limited to, a Hough transform or a Radon transform. In another embodiment, the diffraction pattern quality may be determined based on the quality of indexing the bands in the diffraction pattern. For example, the index quality may be determined by comparing the detected bands in the EBSD pattern and the theoretical calculated bands. The detected bands and the theoretical bands may be compared by measuring a mean average deviation between the detected and the theoretical bands. In another embodiment, the diffraction quality may be determined based on the contrast of the bands in the EBSD pattern.

FIGS. 4A-4F show example EBSD patterns of one impact point formed during the repetitive scan of the ROI. As time increases from FIG. 4A to FIG. 4F, the number of times that the impact point irradiated by the charged particles increases. The total number or the accumulated energy of detected particles scattered from the impact point increases over time. Therefore, as time increases, the bands in the EBSD pattern are easier to be identified, and the structural information may be more accurately extracted. In other words, the EBSD pattern quality (or the signal quality of the corresponding impact point) increases monotonically over time.

In some embodiments, the signal quality of the impact point may be calculated during the single ROI scan. For example, the signal quality of an impact point may be calculated immediately after collecting the particles scattered from the impact point at step 306. In other words, the signal quality of the impact point is calculated in parallel with the scan, before the completion of the single scan.

At 318, the signal quality of the ROI may be calculated based on the signal quality of each impact point within the ROI. For example, the signal quality of the ROI $SQ_{ROI}$ may be the minimal signal quality of all impact points. That is, $$SQ_{ROI} = \min_{x \in [1,X], y \in [1,Y]} \{SQ_{impact\ point}(x, y)\}.$$

In another example, the signal quality of the ROI may be the median or mean of the signal quality of all impact points.

At 320, the signal quality of the ROI is compared with a threshold signal quality. In one embodiment, the threshold signal quality is determined at step 301. For example, the threshold signal quality may be adjusted based on the property of the sample under test. The threshold signal quality may increase with increased sample tolerance to irradiation damage. The threshold signal quality may increase with increased number of phases of the sample. Responsive to the signal quality of the ROI higher than the threshold signal quality, the structural image of the ROI is generated at 328. If the signal quality of the ROI is lower than the threshold signal quality, another single scan of the ROI may be performed after correcting beam drift. During the next single scan, the signal quality of one or more of the impact points may be updated based on the newly detected particles, and the signal quality of the ROI may be updated based on the signal quality of each of the impact points.

At 324, the sample image may be obtained. In one embodiment, obtaining the sample image may include acquiring the same type of sample image as at step 302. In another embodiment, obtaining the sample image may include generating the sample image based on the detected particles in the previous single scan of the ROI. For example, the pixel value of the sample image may be the total dose received by the detector when a corresponding impact point within the ROI is irradiated with the charged particle beam. In other words, the sample image may be expressed as $$I_{x,y} = \sum_{i=1, j=1}^{i=M, j=N} \left[ \int_{t=T1}^{T2} E_{i,j}^{x,y}(t) \right],$$

wherein the previous single scan is from time T1 to time T2, the detector has M-by-N pixels.

At 326, the charged particle beam drift may be corrected based on the sample image obtained at 324. For example, the sample image from 324 is compared with the sample image acquired before the single scan of the ROI. The charged particle beam is then shifted relative to the sample based on the shift between the two sample images. In one example, charged particle beam is shifted via adjusting the deflectors (such as deflectors 112 and 114 of FIG. 1). In another example, the sample location is shifted or translated using the sample holder (such as sample holder 124 of FIG. 1). After correcting the beam drift, another single scan of the ROI is performed.

At 328, one or more imaging parameters may optionally be adjusted for the next single scan of the ROI. For example, imaging parameters including the scan pattern and the dwell time may be adjusted based on the signal quality of each impact point. In another example, one or more of the multiple impact points with signal quality lower than a threshold level may be selected and scanned/irradiated in the following single scan of the ROI, while the rest of the multiple impact points are not scanned/irradiated.

In some embodiments, the scan pattern for each single scan of the ROI is the same. That is, the impact points within the ROI are scanned with the same sequence. For example, the scan pattern may be a raster scan. In another embodiment, the scan pattern for different single scans of the ROI may be different. The scan pattern may be determined based on the signal quality of each impact point. A particular impact point may stop being irradiated in the next single scan of the ROI responsive to the signal quality of the impact point higher than a threshold level. In this way, only a subset of the impact points with low signal quality is imaged in the next single scan. By changing the scan pattern, the total imaging time may be reduced while maintaining the quality of the structural image of the ROI. The signal quality of the impact point may be calculated/updated as shown in step 314. For example, the signal quality of the impact point may be determined/updated based on particles scattered from the impact point over time.

FIGS. 5A and 5B show example scan patterns for different single scans of the ROI 501. The ROI 501 includes multiple impact points 502 (locations of the impact points indicated by circles). As shown in FIG. 5A, the initial single scan of the ROI may be a raster scan shown with dashed line 503, the scan direction is indicated by the arrows. The dwell time at each impact point is the same. After collecting the energy of the backscatter electron at each impact point, a corresponding signal quality of the impact point may be calculated. In FIG. 5B, the signal qualities of the impact points are color coded according to color bar 504. The darker the impact point, the higher the signal quality of the impact point. In the next scan of the ROI, as shown in FIG. 5B, only impact points with the signal quality lower than the threshold 505 are irradiated with the charged particle beam. The new scan pattern 506 is determined based on the signal quality of each impact point.

In some embodiments, the dwell time for each single scan of the ROI may be adjusted based the signal quality of the ROI. For example, the dwell time may be reduced responsive to the change rate of the signal quality of the ROI higher than a threshold change rate. In another example, the dwell time may be reduced responsive to the difference between the signal quality of the ROI and the threshold signal quality less than a threshold.

In this way, the EBSD pattern acquisition is data-driven, that is, the acquisition is controlled based on the feedback of the quality of acquired data, such as the signal quality of the ROI. The imaging parameters for the EBSD pattern acquisition may also be adjusted responsive to the signal quality of each impact point. The dwell time for each impact point within a single scan may be reduced, and the accumulated dwell time of the charged particle beam at each impact point may also be reduced. As a result, the total data acquisition time and the radiation damage of the charged particle beam to the sample may be reduced comparing to the conventional method. Further, because the duration for each single scan of the ROI is reduced, the beam drift may be easily and effectively corrected.

FIG. 6 shows an example timeline for the data-driven EBSD pattern acquisition using an imaging system of FIG. 1. The x-axes of the plots are time. Time increases as indicated by the x-axis arrow. Plot 610 shows the initiation signal for data acquisition. Data acquisition is initiated when the signal value is one and is terminated when the signal value is zero. Plot 620 shows the individual incidence that an electron strikes the pixelated detector. Plot 630 shows the data flow from the EBSD detector to the controller or FPGA of the controller. Plot 640 shows signal quality of the ROI. The signal quality of the ROI increases as indicated by the y-axis arrow.

At T4, the data acquisition is initiated. From T4 to T5, while the charged particle beam scanning the ROI, the detector keeps detecting backscatter electrons. Responsive to each incidence of electron impinging the detector, a data packet is transferred from the detector to the controller. The data packet includes the energy and/or timestamp of the electron, and the position of the electron within the pixelated detector. For example, responsive to incidence 621 of an electron impinging the detector, data packet 631 is transferred to the controller. The data packet 631 includes the energy and/or timestamp of the electron for incidence 621, and the position within the detector at which the electron is received.

At T5, a first single scan of the ROI is completed. The signal quality of the ROI is calculated based on the particles detected from T4 to T5. The signal quality of the ROI is lower than the threshold signal quality 641.

From T5 to T6, the charged particle beam scans the ROI for the second time. The detector keeps passing data packets to the controller responsive to each electron detected by the detector. At T6, the second single scan of the ROI is completed. The signal quality of the ROI is updated based on the particles detected from T4 to T6. The updated signal quality of the ROI is lower than the threshold signal quality 641.

From T6 to T7, the charged particle beam scans the ROI for the third time. The detector keeps passing data packets to the controller responsive to each electron detected by the detector. At T7, the third single scan of the ROI is completed. The signal quality of the ROI is updated based on the particle detected from T4 to T7. Responsive to the updated signal quality of the ROI higher than the threshold signal quality 641, the data acquisition is terminated at T7. The structural image of the ROI may be constructed based on all the particles detected from T4 to T7.

In some embodiments, the duration for each ROI scan may be the same. In other embodiments, the duration for each single ROI scan may decrease with increased time.

In this way, the ROI of the sample is repetitively scanned with the charged particle beam until the signal quality of the ROI is higher than the predetermined threshold signal quality level. The detector keeps sending particle information to the controller immediately upon detecting each particle, during the entire imaging process. The total data acquisition time thus is not limited by the frame readout time as in the conventional EBSD pattern acquisition.

The technical effect of calculating signal quality of the ROI after each single scan of the ROI is that the acquired data quality may be evaluated. Further, responsive to the quality of the acquired data, the repetitive scan may be terminated to reduce the total data acquisition time. As such, the data acquisition time is data-driven and is sample dependent. The technical effect of repetitively scanning the ROI is to reduce the radiation damage to the sample, and the beam drift may be effectively corrected after each single ROI scan. Moreover, the EDS data may be readout after irradiating an impact point for a short dwell time. The technical effect of adjusting the imaging parameters responsive to the signal quality of the ROI is to reduce the duration of single ROI scan while maintaining the quality of the acquired data.

In one embodiment, a method for imaging the sample includes performing a first scan by directing a charged particle beam towards multiple impact points within a ROI, and detecting particles scattered from each impact point of the multiple impact points; calculating a signal quality of each impact point of the multiple impact points based on the detected particles scattered from the impact point; calculating a signal quality of the ROI based on the signal quality of each impact point, wherein the signal quality of the ROI is lower than a threshold signal quality; performing a second scan by directing the charged particle beam towards one or more of the multiple impact points within the ROI after calculating the signal quality of the ROI, and detecting particles scattered from the one or more of the multiple impact points within the ROI; and forming a structural image of the ROI based on the detected particles during the first scan and the second scan. In a first example of the method, the method further includes updating the signal quality of the one or more of the multiple impact points based on the detected particles scattered from the one or more of the multiple impact points during the second scan; and updating the signal quality of the ROI based on the signal quality of the one or more of the multiple impact points, wherein the updated signal quality of the ROI is higher than the threshold signal quality. A second example of the method optionally includes the first example and further includes wherein calculating the signal quality of each impact point of the multiple impact points based on the detected particles scattered from the impact point includes: forming a diffraction pattern for each impact point based on the detected particles scattered from the impact point, and calculating the signal quality of each impact point based on its corresponding diffraction pattern. A third example of the method optionally includes one or more of the first and second examples, and further includes wherein the particles scattered from each impact point of the multiple impact points are detected by a detector, and forming the diffraction pattern for each impact point based on the detected particles scattered from the impact point includes: recording a location of each of the detected particles on the detector; and forming the diffraction pattern based on the location of each of the detected particles. A fourth example of the method optionally includes one or more of the first through third examples, and further includes wherein calculating the signal quality of each impact point based on its corresponding diffraction pattern includes calculating the signal quality of each impact point based on a quality of its corresponding diffraction pattern. A fifth example of the method optionally includes one or more of the first through fourth examples, and further includes wherein each pixel of the structural image corresponds to an impact point of the multiple impact points within the ROI. A sixth example of the method optionally includes one or more of the first through fifth examples, and further includes, wherein forming the structural image of the ROI based on the detected particles during the first scan and the second scan includes: forming a diffraction pattern for each impact point based on the detected particles scattered from the impact point during the first scan and the second scan, and determining a pixel value of the structural image corresponding to a particular impact point based on the diffraction pattern of the impact point. A seventh example of the method optionally includes one or more of the first through sixth examples, and further includes comprising correcting a charged particle beam drift between the first scan and the second scan. An eighth example of the method optionally includes one or more of the first through seventh examples, and further includes wherein detecting particles scattered from each impact point of the multiple impact points includes: in response to each scattered particle impinging a detector, recording an energy or a timestamp of the impinged scattered particle, and a location of the impinged scattered particle on the detector. A ninth example of the method optionally includes one or more of the first through eighth examples, and further includes selecting the one or more of the multiple impact points based on the signal quality of each impact point before the second scan.

In one embodiment, a method for imaging the sample includes repetitively scanning a region of interest (ROI) of the sample by directing a charged particle beam towards multiple impact points of the ROI and detecting particles scattered from the multiple impact points; during the repetitive scan, calculating a signal quality of each impact point of the multiple impact points, and updating a signal quality of the ROI based on the signal quality of each impact point after each single scan of the ROI, wherein the signal quality of a particular impact point is calculated based on the detected particles scattered from the impact point; terminating the repetitive scan responsive to the signal quality of the ROI higher than a threshold signal quality; and forming a structural image of the ROI based on the detected particles during the repetitive scan. In a first example of the method, wherein each pixel in the structural image corresponds to an impact point of the multiple impact point, and wherein forming the structural image of the ROI based on the detected particles during the repetitive scan includes: for each impact point, forming a diffraction pattern based on all of the detected particles scattered from the impact point; and determining each pixel value of the structural image of the ROI based on its corresponding diffraction pattern. A second example of the method optionally includes the first example and further includes adjusting a scan pattern of the repetitive scan based on the signal quality of each impact point of the multiple impact points during the repetitive scan. A third example of the method optionally includes one or more of the first and second examples, and further includes wherein the signal quality of each impact point increases monotonically during the repetitive scan.

In one embodiment, a system for imaging a sample includes a charged particle source for generating a charged particle beam towards a sample; a detector for detecting scattered particles from the sample; and a controller with computer readable instructions stored in a non-transitory medium, configured to: perform a first scan by directing a charged particle beam towards multiple impact points within a ROI, and detecting particles scattered from each impact point of the multiple impact points; calculate a signal quality of each impact point of the multiple impact points based on the detected particles scattered from the impact point; calculate a signal quality of the ROI based on the signal quality of each impact point, wherein the signal quality of the ROI is lower than a threshold signal quality; perform a second scan by directing the charged particle beam towards one or more of the multiple impact points within the ROI after calculating the signal quality of the ROI, and detecting particles scattered from the one or more of the multiple impact points within the ROI; and form a structural image of the ROI based on the detected particles during the first scan and the second scan. In a first example of the system, the system further includes a detector for imaging an area of the sample including the ROI, and the controller is further configured to: acquire a first sample image before the first scan, acquire a second sample image between the first scan and the second scan, and correct a charged beam drift by comparing the first sample image and the second sample image before the second scan. A second example of the system optionally includes the first example and further includes wherein the controller is further configured to: form a first sample image based on detected particles during the first scan; form a second sample image based on the detected particles during the second scan; and correct a charged beam drift by comparing the first sample image and the second sample image before the second scan. A third example of the system optionally includes one or more of the first and second examples, and further includes wherein a dwell time of the charged particle beam at each impact point of the multiple impact points during the first scan is less than 100 microseconds. A fourth example of the system optionally includes one or more of the first and third examples, and further includes wherein the controller is further configured to: update the signal quality of each impact point based on the detected particles scattered from the one or more of the multiple impact points during the second scan, update the signal quality of the ROI based on the updated signal quality of each impact point, wherein the updated signal quality of the ROI is higher than the threshold signal quality. A fifth example of the system optionally includes one or more of the first and fourth examples, and further includes wherein each pixel in the structural image corresponds to an impact point of the multiple impact point, and calculate the signal quality of each impact point based on the detected particles scattered from the impact point includes: form a diffraction pattern corresponding to each impact point based on relative location of each detected particles on the detector, and calculate the signal quality of each impact point based on a quality of the corresponding diffraction pattern for extracting structural information.

What is claimed is:
1. A method for imaging a sample, comprising:
  performing a first scan by directing a charged particle beam towards multiple impact points within a ROI of the sample, and detecting particles scattered from each impact point of the multiple impact points;
  calculating a signal quality of each impact point of the multiple impact points based on the detected particles scattered from the impact point, wherein the signal quality of the impact point indicates an accuracy for extracting structural information;
  calculating a signal quality of the ROI based on the signal quality of each impact point;

responsive to the signal quality of the ROI lower than a threshold signal quality, performing a second scan by directing the charged particle beam towards one or more of the multiple impact points within the ROI, and detecting particles scattered from the one or more of the multiple impact points within the ROI;

forming an electron backscattered diffraction (EBSD) pattern for each impact point of the multiple impact points based on the detected particles scattered from the impact point during the first scan and the second scan; and forming a structural image of the ROI based on the EBSD pattern.

2. The method of claim 1, further comprising updating the signal quality of the one or more of the multiple impact points based on the detected particles scattered from the one or more of the multiple impact points during the second scan; and updating the signal quality of the ROI based on the signal quality of the one or more of the multiple impact points, wherein the updated signal quality of the ROI is higher than the threshold signal quality.

3. The method of claim 1, wherein calculating the signal quality of each impact point of the multiple impact points based on the detected particles scattered from the impact point includes: forming a diffraction pattern for each impact point based on the detected particles scattered from the impact point, and calculating the signal quality of each impact point based on its corresponding diffraction pattern.

4. The method of claim 3, wherein the particles scattered from each impact point of the multiple impact points are detected by a detector, and forming the diffraction pattern for each impact point based on the detected particles scattered from the impact point includes: recording a location of each of the detected particles on the detector; and forming the diffraction pattern based on the location of each of the detected particles.

5. The method of claim 4, wherein calculating the signal quality of each impact point based on its corresponding diffraction pattern includes calculating the signal quality of each impact point based on a quality of its corresponding diffraction pattern.

6. The method of claim 1, wherein each pixel of the structural image corresponds to an impact point of the multiple impact points within the ROI.

7. The method of claim 1, forming the structural image of the ROI based on the EBSD includes determining a pixel value of the structural image corresponding to a particular impact point based on the EBSD pattern of the impact point.

8. The method of claim 1, further comprising correcting a charged particle beam drift between the first scan and the second scan.

9. The method of claim 1, wherein detecting particles scattered from each impact point of the multiple impact points includes: in response to each scattered particle impinging a detector, recording an energy or a timestamp of the impinged scattered particle, and a location of the impinged scattered particle on the detector.

10. The method of claim 1, further comprising selecting the one or more of the multiple impact points based on the signal quality of each impact point before the second scan.

11. A method for imaging a sample, comprising:
repetitively scanning a region of interest (ROI) of the sample by directing a charged particle beam towards multiple impact points of the ROI and detecting particles scattered from the multiple impact points;
during the repetitive scan, calculating a signal quality of each impact point of the multiple impact points, and updating a signal quality of the ROI based on the signal quality of each impact point after each single scan of the ROI, wherein the signal quality of a particular impact point indicates an accuracy for extracting structural information based on the detected particles scattered from the impact point;
terminating the repetitive scan responsive to the signal quality of the ROI higher than a threshold signal quality;
forming an electron backscattered diffraction (EBSD) pattern for each impact point of the multiple impact points based on all of the detected particles scattered from the impact point during the repetitive scan; and
forming a structural image of the ROI based on the EBSD pattern.

12. The method of claim 11, wherein each pixel in the structural image corresponds to an impact point of the multiple impact point, and wherein forming the structural image of the ROI based on the detected particles during the repetitive scan includes determining each pixel value of the structural image of the ROI based on its corresponding EBSD pattern.

13. The method of claim 11, further comprising adjusting a scan pattern of the repetitive scan based on the signal quality of each impact point of the multiple impact points during the repetitive scan.

14. The method of claim 11, wherein the signal quality of each impact point increases monotonically during the repetitive scan.

15. A system for imaging a sample, comprising:
a charged particle source for generating a charged particle beam towards a sample;
a detector for detecting scattered particles from the sample; and
a controller with computer readable instructions stored in a non-transitory medium, configured to:
perform a first scan by directing a charged particle beam towards multiple impact points within a ROI, and detecting particles scattered from each impact point of the multiple impact points;
calculate a signal quality of each impact point of the multiple impact points based on the detected particles scattered from the impact point, wherein the signal quality of the impact point indicates an accuracy for extracting structural information;
calculate a signal quality of the ROI based on the signal quality of each impact point, wherein the signal quality of the ROI is lower than a threshold signal quality;
perform a second scan by directing the charged particle beam towards one or more of the multiple impact points within the ROI after calculating the signal quality of the ROI, and detecting particles scattered from the one or more of the multiple impact points within the ROI;
form an electron backscattered diffraction (EBSD) pattern for each impact point of the multiple impact points based on the detected particles scattered from the impact point during the first scan and the second scan; and
form a structural image of the ROI based on the EBSD pattern.

16. The system of claim 15, further comprising a detector for imaging an area of the sample including the ROI, and the controller is further configured to: acquire a first sample image before the first scan, acquire a second sample image between the first scan and the second scan, and correct a charged beam drift by comparing the first sample image and the second sample image before the second scan.

17. The system of claim 15, wherein the controller is further configured to: form a first sample image based on detected particles during the first scan; form a second sample image based on the detected particles during the second scan; and correct a charged beam drift by comparing the first sample image and the second sample image before the second scan.

18. The system of claim 15, wherein a dwell time of the charged particle beam at each impact point of the multiple impact points during the first scan is less than 100 microseconds.

19. The system of claim 15, wherein the controller is further configured to: update the signal quality of each impact point based on the detected particles scattered from the one or more of the multiple impact points during the second scan, update the signal quality of the ROI based on the updated signal quality of each impact point, wherein the updated signal quality of the ROI is higher than the threshold signal quality.

20. The system of claim 15, wherein each pixel in the structural image corresponds to an impact point of the multiple impact points, and calculate the signal quality of each impact point based on the detected particles scattered from the impact point includes: form a diffraction pattern corresponding to each impact point based on relative location of each detected particles on the detector; and calculate the signal quality of each impact point based on a quality of the corresponding diffraction pattern for extracting the structural information.

* * * * *